US008412993B2

(12) United States Patent
Song et al.

(10) Patent No.: US 8,412,993 B2
(45) Date of Patent: Apr. 2, 2013

(54) SELF-ADJUSTING CRITICAL PATH TIMING OF MULTI-CORE VLSI CHIP

(75) Inventors: Peilin Song, Yorktown Heights, NY (US); Franco Stellari, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/788,987

(22) Filed: May 27, 2010

(65) Prior Publication Data

US 2011/0296266 A1    Dec. 1, 2011

(51) Int. Cl.
*G01R 31/28* (2006.01)
(52) U.S. Cl. .................. 714/731; 714/726; 714/748
(58) Field of Classification Search .............. 714/731, 714/726, 748, 798, 736, 719
See application file for complete search history.

(56) References Cited

U.S. PATENT DOCUMENTS

| 7,139,947 | B2 * | 11/2006 | Miner et al. | 714/726 |
|---|---|---|---|---|
| 7,627,797 | B2 * | 12/2009 | Miner et al. | 714/726 |
| 2005/0156370 | A1 * | 7/2005 | Lang et al. | 271/9.1 |

* cited by examiner

*Primary Examiner* — Fritz Alphonse
(74) *Attorney, Agent, or Firm* — F. Chau & Associates, LLC; Anne V. Dougherty, Esq.

(57) ABSTRACT

A method for adjusting timing of multiple cores within an integrated circuit includes selecting a reference core and a target core from among a plurality of cores of an integrated circuit. Self-test circuitry of the integrated circuit is used to generate a response signature for each of the reference core and the target core. The response signature of the reference core is compared with the response signature of the target core. A local clock buffer of the target core is adjusted until the response signature of the target core matches the response signature of the reference core.

24 Claims, 6 Drawing Sheets

SELF-ADJUSTING CRITICAL PATH TIMING OF MULTI-CORE VLSI CHIP

BACKGROUND OF THE INVENTION

1. Technical Field

The present disclosure relates to multi-core integrated circuits and, more specifically, to a system and method for self-adjusting critical path timing of multi-core very-large-scale integration (VLSI) chips.

2. Discussion of Related Art

Very-large-scale integration (VLSI) is a process for creating modern complex integrated circuits that may contain thousands, millions, and often billions of transistor-based circuits on a single chip. Such chips may include microprocessors such as central processing units (CPUs) for computer systems, system-on-chip devices, digital signal processors, graphical processing units (GPUs) and the like.

A modern trend in microprocessor design is to utilize two or more independent cores within a single chip. Efficiency gains may then be achieved as each of the cores is able to independently process instructions. While today many commercially available multi-core microprocessors are dual-core or quad-core, microprocessors including substantially higher-order cores are also available or in development.

Many software applications are designed to divide instructions into multiple threads that may be processed in parallel by the multiple cores of the microprocessor. Such applications may be well suited for exploiting the potential of multi-core microprocessors. For many of these applications, the multiple cores may operate, to some extent, asynchronously, with each core responsible for processing its own threads. However, some other applications may be able to benefit from the multiple cores operating in synchronous. Synchronizing the timing of the multiple cores may be difficult, as subtle manufacturing variations within the multiple-cores may permit some cores to operate at different speeds. These differences in core speeds may result in distinct critical path timing for each core.

SUMMARY

A method for adjusting timing of multiple cores within an integrated circuit includes selecting a reference core and a target core from among a plurality of cores of an integrated circuit. Self-test circuitry of the integrated circuit is used to generate a response signature for each of the reference core and the target core. The response signature of the reference core is compared with the response signature of the target core. A local clock buffer of the target core is adjusted until the response signature of the target core matches the response signature of the reference core.

A multi-core integrated circuit with elements for synchronizing the multiple cores includes a first integrated circuit core including a first multiple input shift register for generating a first response signature in response to a test pattern processed by the first integrated circuit core and a second integrated circuit core including a second multiple input shift register for generating a second response signature in response to the test pattern processed by the second integrated circuit core. A first latch receives the first response signature and a scan clock signal and a second latch receives the second response signature and the scan clock signal. A checker receives output from the first and second latches for checking when the first response signature is substantially identical to the second response signature.

A system for adjusting timing of multiple cores within an integrated circuit includes a first integrated circuit core including a first multiple input shift register for generating a first response signature in response to a test pattern processed by the first integrated circuit core and a second integrated circuit core including a second multiple input shift register for generating a second response signature in response to the test pattern processed by the second integrated circuit core. A checker receives the first response signature and the second response signature and produces an output signal indicating whether the first response signature is substantially identical to the second response signature.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
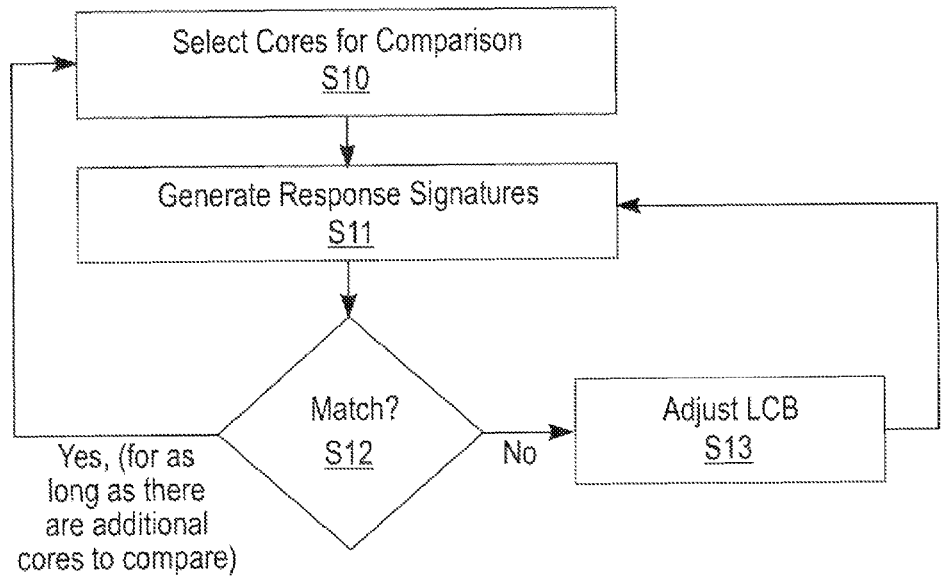
FIG. 1 is a flow chart illustrating an approach for using self-test circuitry of a multi-core integrated circuit to reduce timing skew across the multiple cores thereof according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to provide integrated circuits such as microprocessors that are capable of self-adjusting critical path timing of multiple cores, for example, so that one or more of the multiple cores of the microprocessor may function substantially in synchronous.

As described above, synchronization of multiple cores is complicated by subtle variations across the chip and from core-to-core. These variations may result in timing skew between identical processing paths executed on different cores. Accordingly, exemplary embodiments of the present invention seek to reduce the timing skew across multiple cores to enhance multi-core synchronization.

Many integrated circuits may be manufactured to include a logic built-in self-test (LBIST). The LBIST is circuitry that is designed to simplify the testing of the integrated circuit that contains the LBIST by, for example, generating a random stimulus and gauge the integrated circuit's response to the generated stimulus by capturing a response to the stimulus within a multiple input shift register (MISR). The MISR then may generate a response signature that may be matched against an expected response signature. If the response signature matches the expected response, then the integrated circuit may be seen as fully operational.

The LBIST may thus be used at either the wafer level, the chip level or at the system level to determine the operational status of the integrated circuit.

Accordingly, the LBIST is a component of the integrated circuit that effects a self-test. After fabrication, a microprocessor may be set into a self-test mode in which the LBIST may be used to test the functionality of the integrated circuit. Here, the LBIST generally provides a simple pass or fail output indicating the operational status of the integrated circuit.

Exemplary embodiments of the present invention seek to use self-test circuitry such as the LBIST or other automatic test pattern generation circuitry to reduce the timing skew across multiple cores to enhance multi-core synchronization. In this way, the LBIST, or similar circuitry, is used for a novel purpose that is other than testing the functionality of the integrated circuit. FIG. 1 is a flow chart illustrating an approach for using self-test circuitry of a multi-core integrated circuit to reduce timing skew across the multiple cores thereof according to an exemplary embodiment of the present invention.

First, two cores of the integrated circuit may be selected for comparison (Step S10). As exemplary embodiments of the present invention seek to tune the function of each core, the various cores may all be brought into synchronization by systematically synchronizing two cores at a time until all cores are in synchronous with one another. As described herein, a first core may be synchronized with a second core, the second core synchronized to the third core, and so on until all cores are synchronized. However, this two-at-a-time approach is offered for the purposes of keeping the explanation of the invention as simple as possible, and it is to be understood that other approaches to synchronizing the cores may be used. For example, each core may be synchronized to a particular reference core or all cores may be synchronized to a reference level that is not determined by one of the cores.

After two cores have been selected for comparison (Step S10), the self-test circuitry, for example, the LBIST, may be used to generate a response signature for processing one or more critical paths for each core of the integrated circuit (Step S11). For example, a particular response signature may be generated for each core for a given critical path at a given frequency. This step may be performed for each of the multiple cores, for each of the given critical paths, and at each of a number of different frequencies, as desired. Where it is desired that response signatures be generated at multiple different frequencies, various different frequencies may be achieved by shmooing the chip across a range of cycle times.

Then, the generated response signatures may be compared (Step S12). Comparison of the response signatures may include comparing the response signatures for each of the currently selected cores for the same critical path and the same frequency, although the comparison may be repeated for different critical paths and/or different frequencies. A simple on-chip comparator may be used, for example, to compare the response signature from the MISRs of the various cores. If it is determined that the response signatures for the selected cores match (Yes, Step S12), for example, because for each critical path and at each frequency, the response signatures for each core are identical, then the two cores may be considered to be in synchronous and a next set of cores may be selected for comparison (Step S10). If, however, it is determined that the response signatures for the selected cores do not match (No, Step S12), for example, because for any given critical path or frequency, the response signatures for each core are not identical, then a setting of a local clock buffer (LCB) for one of the mismatched cores may be adjusted (Step S13). As each of the multiple cores may have its own LCB, and the LCB of either of the selected cores may be adjusted to better synchronize the two cores, it may not matter which LCB is adjusted during the first comparison. However, in subsequent comparisons, it may be important that the LCB of a previously synchronized core not be changed. Thus where there is a reference core, the LCB of the other core may be adjusted and where the cores are compared in series, for example, a first core with a second core, the second core with a third core, the third core with a fourth core, etc., in the first comparison between the first core and the second core it may not matter which LCB is adjusted, however, in the next comparison between the second core and the third core, the LCB from the third core should be adjusted to avoid breaking synchronization between the first core and the second core. For example, in the first comparison, the LCB of the slower path may be adjusted.

Adjusting of the LCB may include reprogramming the programmable LCB to a different level. After the LCB of one of the mismatched cores has been reprogrammed, response signatures may again be generated (Step S11) and it may again be determined whether there is a match between response signatures. As adjustments to the LCB of one of the selected cores may be used to offset timing skews, the selected cores may be brought into synchronization with one another. After all cores have been successfully synchronized, for example, in pairs, as discussed above, the process may end.

The LCB may also be changed with respect to particular critical paths and as such, synchronization by LBIST comparison and LCB adjustment may be performed for each critical path of a list of desired critical paths. Because of the fact that many multi-core integrated circuits may already include an LBIST and LCBs for each core, minimal integrated circuit redesign may be required to perform the above-described method for minimizing timing skew between cores according to exemplary embodiments of the present invention. Moreover, integrated circuit redesign needs only include minimal extra elements, for example, a few logic gates and some non-timing-critical wires. Accordingly, exemplary embodiments of the present invention need not noticeably add to integrated circuit complexity.

Synchronizing of the multiple cores of an integrated circuit, as described above, may be performed at any stage of system assembly. For example, it may be performed at the wafer level where multiple integrated circuits still occupy a single wafer, at a chip level where each integrated circuit has been cut from the wafer and possibly packaged, or at a system level after the integrated circuit has been implemented into a computer system. Additionally, performance of synchronization as described above need not be limited to manufacturing. Exemplary embodiments of the present invention may be performed in the field and may be repeated as desired to correct for stress, degradation and other subtle changes that may affect an integrated circuit with use and time.

According to other exemplary embodiments of the present invention, rather than using an LBIST or other design-for-test chip feature, external testing circuits may be used to determine and compare response signatures and reprogram LCBs as described above. In such a case, no circuit overhead need be added to the integrated circuit to perform exemplary embodiments of the present invention.

While other variations of chip design may be used, exemplary embodiments of the present invention may utilize a level sensitive scan design (LSSD). The LSSD methodology is a system design and a Design-for-Test (DFT) approach that incorporates several basic test concepts such as scan design. En such a design most of the device's storage elements, such as latches or registers are concatenated in one or more scan chains and can be externally accessible via one or more serial inputs and outputs. Storage elements that are not in this category are usually memory or other special macros that are isolated and tested independently.

LSSD is described in detail in U.S. Pat. Nos. 4,293,919; 3,783,254; 3,761,695; and 3,784,907, each of which is incorporated herein by reference.

Figure 2:
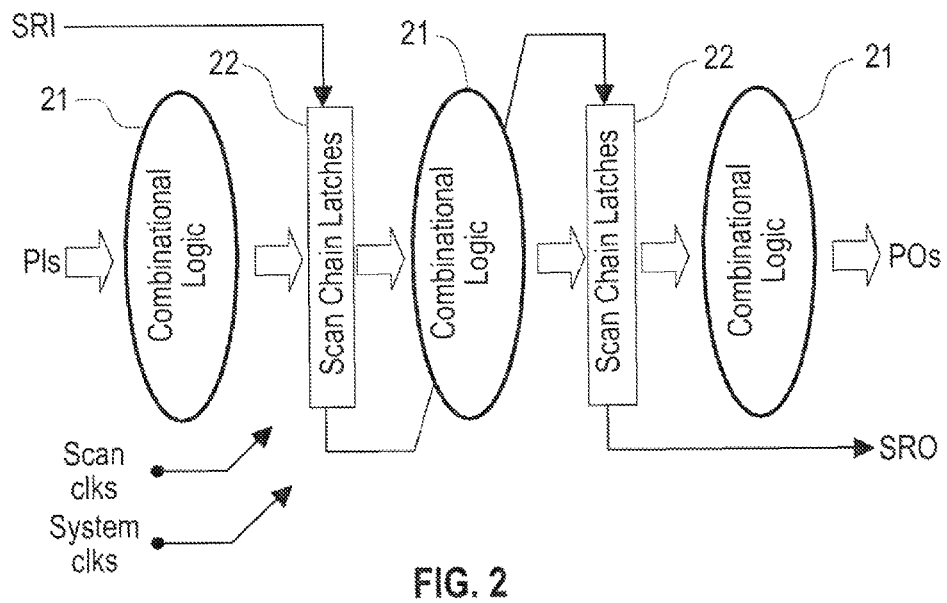
FIG. 2 is a diagram illustrating a typical LSSD configuration that may be used according to exemplary embodiments of the present invention.

FIG. 2 is a diagram illustrating a typical LSSD configuration that may be used according to exemplary embodiments of the present invention. The LSSD design methodology may ensure that all logic feedback paths are gated by one or more storage elements, thereby simplifying a sequential design into subsets of combinational logic sections 21. This design concepts may be used in conjunction with the associated system clocking (System clks) and scan clocking (Scan clks) sequences to simplify the test generation, testing, and diagnosability of very complex logic structures. Each of a plurality of scan chain latches 22 may be used as a pseudo Primary Input (PI) and as a pseudo Primary Output (PO) in addition to the standard PIs and POs to enhance the stimulation and observability of the device being tested or diagnosed. The combinational logic sections 21.

Figure 3:
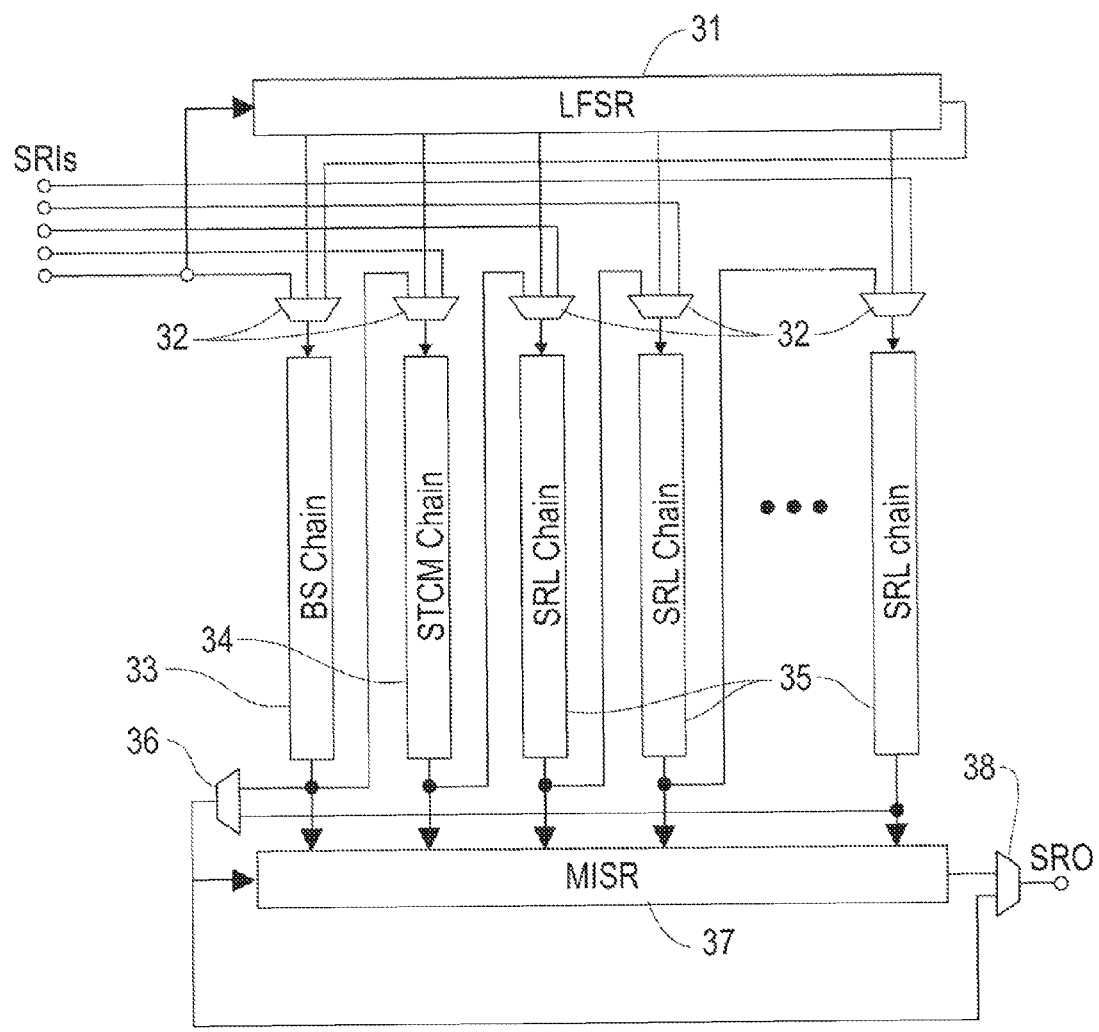
FIG. 3 is a circuit diagram illustrating a STUMPS configuration having an LBIST configuration according to an exemplary embodiment of the present invention.

Self-test circuitry used in performance of exemplary embodiments of the present invention may be in the form of a Self-Test Using MISR and parallel SRSG (STUMPS). As described above, a MISR is a Multiple Input Shift Register. SRSG is a Shift Register Sequence Generator. A STUMPS may take the form of an LBIST, as described above, or other variations may be used. FIG. 3 is a circuit diagram illustrating a STUMPS configuration having an LBIST configuration according to an exemplary embodiment of the present invention.

The Linear Feedback Shift Register (LFSR) structure 31 illustrated in FIG. 3 may be used to generate pseudo random patterns. These patterns may be scanned in through scanable latches via scan clocks (SRIs). The scannable latches may include, for example, a boundary scan chain 33, a self-test control macro chain, and shift register latch chains 35. Multiplexors 32 may be used to provide the appropriate control signals to configure the scannable latches into different scan chains. Then, system clocks may be used to insert these patterns to the combination logic and scan clocks may be used to scan the test responses to the MISR 37. Another multiplexor 36 may be used to collect the output of the scannable latches and provide them to the MISR 37 or multiplexor 38. A certain number of responses (loops) may be compressed into MISR and constructed as a signature. This signature may be compared with a simulation signature and the result may be used to show if the chip is good or bad. Additionally, or alternatively, the signature may be compared with a signature generated at a lower frequency. Another multiplexor 38 may be used to provide the constructed signature and the simulation signature to a single output SRO.

Figure 4:
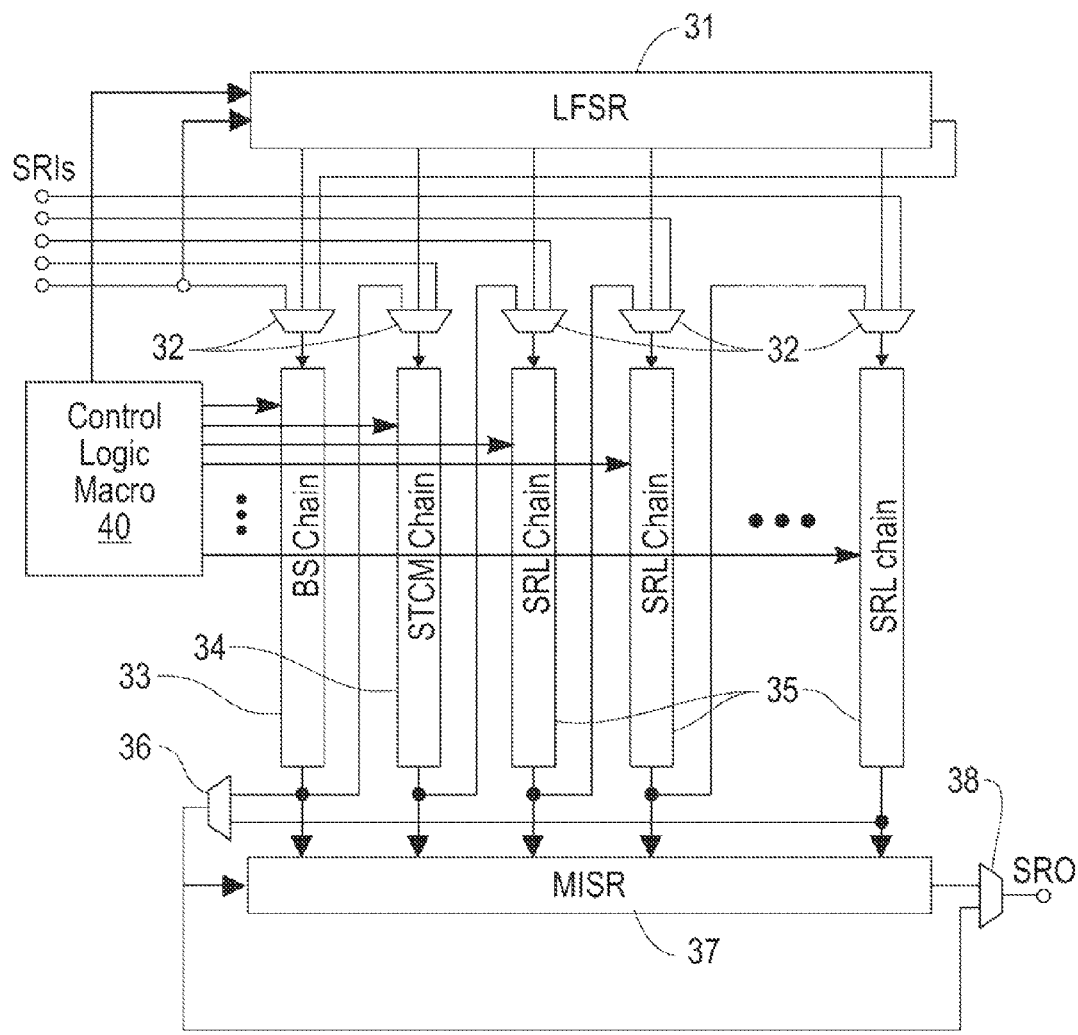
FIG. 4 is a circuit diagram illustrating a STUMPS structure including control logic, such as a control logic macro, according to an exemplary embodiment of the present invention.

This STUMPS structure may be further enhanced by adding some control logic to not only let the test results from a group of latches compress into MISR 37, but an individual latch as well. FIG. 4 is a circuit diagram illustrating a STUMPS structure including control logic, such as a control logic macro 40, according to an exemplary embodiment of the present invention. This added feature may be referred to herein as a selective signature feature. Using the structure illustrated in FIG. 4, each path on a chip may be tested by selecting one latch at a time to compress into MISR 37 while shmooing the chip. Once all the results from each latch are recorded, top critical paths may be determined.

In particular, the control logic macro 40 may have the ability to select a desired scan chain and a desired latch. Output from the selected latch alone may then be sent to the MISR 37 to generate a signature specific to the selected latch. Then, in implementing the selective signature feature, each latch may be tested as the running frequency is stepped up in small increments, for example, by shmooing, to determine the frequency at which the latch signature becomes erroneous (i.e. changes). Using this technique, the first latch or latches to change signatures, as the running frequency is increased, may be regarded as top critical paths as the corresponding integrated circuit core would not be able to function faster than the frequency that caused these latches to produce erroneous signatures. As exemplary embodiments of the present invention may then modify the LCB corresponding to the critical path latch, the critical path may be driven at a higher running frequency, and accordingly, the corresponding core could be driven at a higher running frequency thereby reducing timing skews between cores of the integrated circuit.

Figure 5:
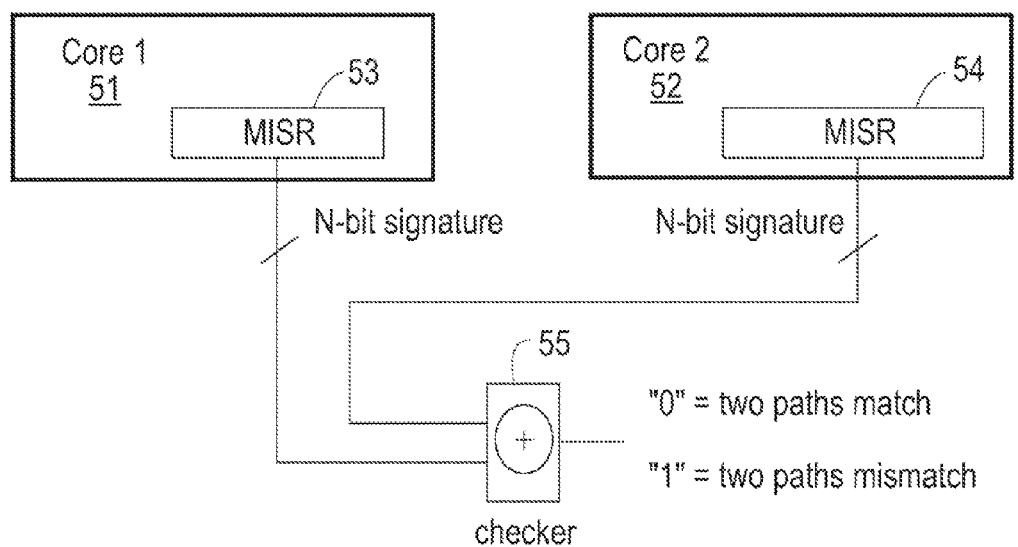
FIG. 5 is a block diagram showing a path optimization scheme according to an exemplary implementation of the present invention.

In a multi-core integrated circuit design, each core may have its own MISR 37. The LBIST may run independently. For synchronized cores, MISR signatures should be the same for a given selected path, pattern number (loops), and running frequencies. Accordingly, exemplary embodiments of the present invention seek to reduce the timing skew between the identical paths on two different cores by tuning the LCB setting. FIG. 5 is a block diagram showing a path optimization scheme according to an exemplary implementation of the present invention. Here, two n-bit signatures of the MISRs 53 (of a first core 51) and 54 (of a second core 52) are compared after a certain number of LBIST loops at same running clock frequencies on two cores, for example, using a checker 55. A 2N-input XOR may be used as a suitable checker 55. For a given running frequency, the logic "1" on the checker 55 output may indicate that two paths are mismatch while logic "0" may show that two path are match. The overhead for this scheme is 2N wires and 2N-input XOR gate.

Figure 6:
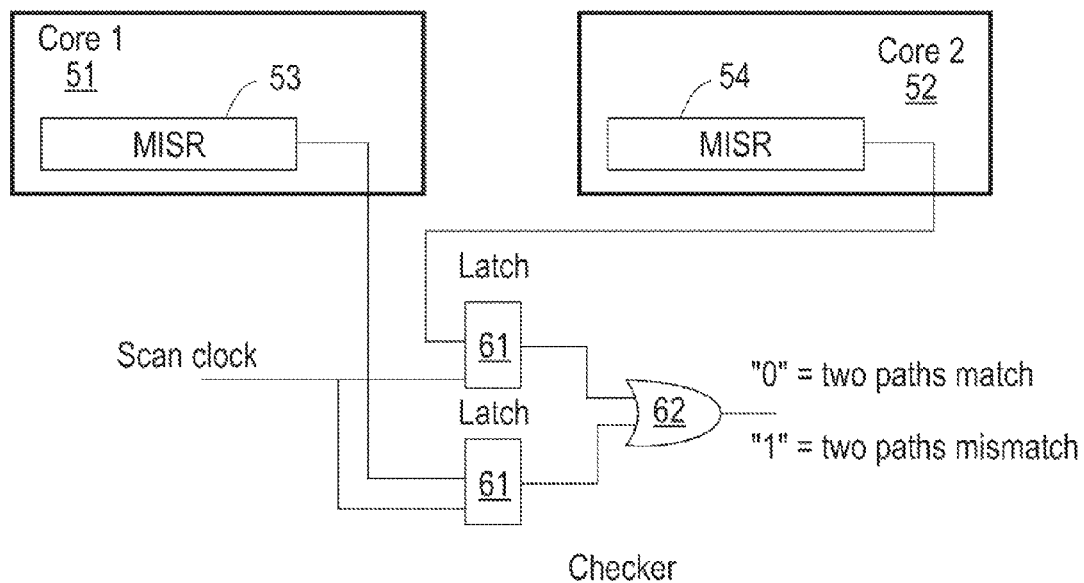
FIG. 6 is a block diagram showing a path optimization scheme according to an exemplary embodiment of the present invention.

FIG. 6 is a block diagram showing a path optimization scheme according to an exemplary embodiment of the present invention. Unlike the configuration shown in FIG. 5, here two individual MISRs 53 and 54 are compared bit by bit and MISR outputs are loaded to latches 61 following by a two-input XOR gate checker 62. When two MISRs are not matched, the skew of two clocks controlling the measured latches 61 can be adjusted by LCB.

Figure 7:
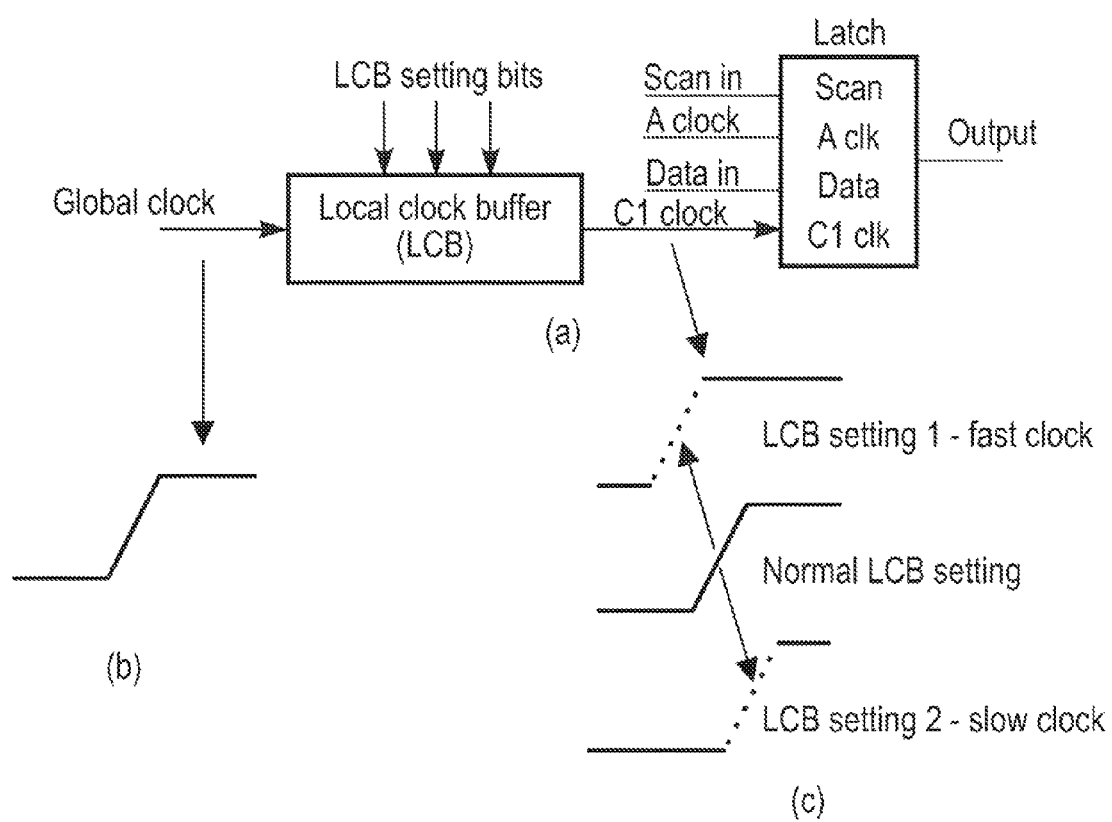
FIG. 7 is a block diagram illustrating an LCB setting and clock timing control according to an exemplary embodiment of the present invention.

FIG. 7 is a block diagram illustrating an LCB setting and clock timing control according to an exemplary embodiment of the present invention. The LCB may be designed such that the capture clock edge can move either early or late compared to normal setting. Reference (a) shows how LCB controls the latch. LCB setting bits (three bits are shown, they could be more or less bits) can be provided through scannable latches. Reference (b) shows the local clock that arrives at the LCB and reference (c) shows the output clock after LCB, the output clock may be faster or slower depending upon the settings.

Figure 8:
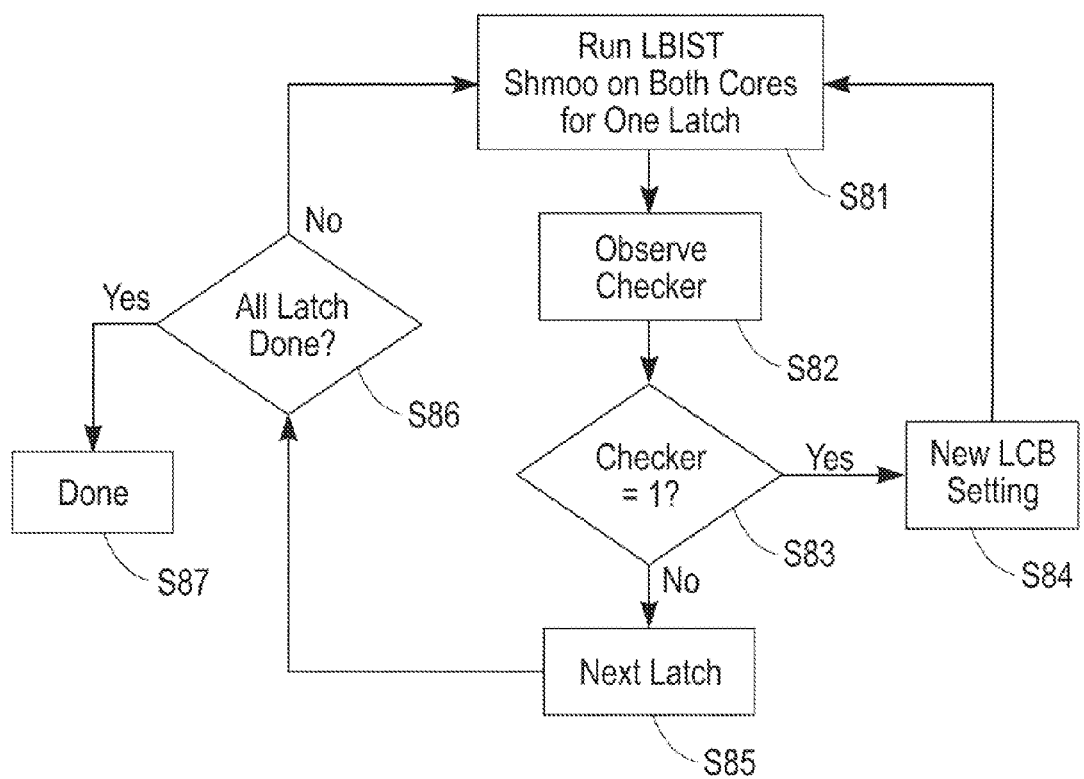
FIG. 8 is a flow chart illustrating a method for implementing self-adjusting critical path timing of multi-core integrated circuits according to an exemplary embodiment of the present invention.

FIG. 8 is a flow chart illustrating a method for implementing self-adjusting critical path timing of multi-core integrated circuits according to an exemplary embodiment of the present invention. For a given identical path, for example, a latch, on two cores, selective signature may be performed, for example, by shmooing in time domain (Step S81). Then, two signatures are compared with checker (Step S82). If "1" is the result (Yes, Step S83), the LCB setting for the slow core is adjusted to move the edge faster (Step S84). Then LBIST is run again (Step S81) till logic "0" is shown (No, Step S83). Then, the next latch is selected (Step S85) for as long as all latches are not complete (No, Step S86) and the process is repeated for the next selected set of latches (Step S81). When all latches are complete (Yes, Step S86), the process may be complete (Step S87).

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for adjusting critical path timing of one or more cores within a multi-core integrated circuit, comprising:
    selecting a reference core and a target core from among a plurality of cores of an integrated circuit;
    using self-test circuitry of the integrated circuit to generate a response signature for each of the reference core and the target core;
    comparing the response signature of the reference core with the response signature of the target core; and
    adjusting a local clock buffer of the target core until the response signature of the target core matches the response signature of the reference core, thereby adjusting the critical path timing of the target core.

2. The method of claim 1, wherein generating a response signature for the target core includes generating a selective response signature for each path of the target core and determining a critical path of the target core, comparing the response signature of the reference core with the response signature of the target core includes using the response signature of the critical path of the target core as the response signature of the target core, and adjusting the local clock buffer of the target core includes adjusting the local clock buffer of the critical path of the target core.

3. The method of claim 2, wherein determining the critical path of the target core includes generating a selective response signature for each path of the target core at a series of different clock frequencies and determining which path of the target core is the first path to generate an erroneous response signature as the clock frequencies are increased.

4. The method of claim 1, wherein the response signature is generated by the self-test circuitry by generating a pseudo random input, processing the generated pseudo random input along one or more pathways of the integrated circuit, and generating the response signatures using output from the one or more pathways.

5. The method of claim 4, wherein the one or more pathways comprise at least one critical path that is limiting of the operating frequency of the integrated circuit.

6. The method of claim 4, wherein the pseudo random input is generated by a linear feedback shift register.

7. The method of claim 4, wherein the response signature is generating using the output from the one or more pathways by collecting and compressing the output into response signatures using a multiple input shift register.

8. The method of claim 1, wherein the response signature of the target core matches the response signature of the reference core when the two cores are substantially synchronized and the response signature of the target core does not matches the response signature of the reference core when the two cores are not substantially synchronized.

9. The method of claim 1, wherein after the response signature of the target core matches the response signature of the reference core, the method is repeated selecting the same core as the reference core and a different core as the target core until all cores have been selected.

10. The method of claim 1, wherein after the response signature of the target core matches the response signature of the reference core, the method is repeated selecting the original target core as the new reference core and a different core as the target core until all cores have been selected.

11. A multi-core integrated circuit, comprising:
    a first integrated circuit core comprising a first multiple input shift register for generating a first response signature in response to a test pattern processed by the first integrated circuit core;
    a second integrated circuit core comprising a second multiple input shift register for generating a second response signature in response to the test pattern processed by the second integrated circuit core;
    a first latch receiving the first response signature and a scan clock signal;
    a second latch receiving the second response signature and the scan clock signal; and
    a checker receiving output from the first and second latches for checking when the first response signature is substantially identical to the second response signature.

12. The circuit of claim 11, wherein the first integrated circuit core additionally comprises a first local clock buffer and the second integrated circuit core additionally comprises a second local clock buffer and the system additionally comprises a clock timing control unit for adjusting either the first local clock buffer or the second local clock buffer when the checker determines that the first response signature is not substantially identical to the second response signature.

13. The circuit of claim 11, wherein the checker comprises an XOR gate.

14. The circuit of claim 11, wherein the first multiple input shift register generates the first response signature in response to the test pattern by collecting and compressing output from the first integrated circuit core and the second multiple input shift register generates the second signature in response to the test pattern by collecting and compressing output from the second integrated circuit core.

15. The circuit of claim 14, wherein the output from the first and second integrated circuit cores is generated by the processing of pseudo random input along one or more pathways of the corresponding integrated circuit cores.

16. The circuit of claim 15, wherein the one or more pathways comprise at least one critical path that is limiting of the operating frequency of the integrated circuit.

17. The circuit of claim 15, wherein the pseudo random input is generated by a linear feedback shift register.

18. The circuit of claim 11, wherein each of the first and second integrated circuit cores additionally comprise a linear feedback shift register for generating the corresponding test pattern.

19. The circuit of claim 11, wherein each of the first and second integrated circuit cores additionally comprise a control logic for sending output from a selected pathway of the corresponding integrated circuit core to the corresponding multiple input shift register for generating the corresponding response signature.

20. An integrated circuit system, comprising:
- a first integrated circuit core comprising a first multiple input shift register for generating a first response signature in response to a test pattern processed by the first integrated circuit core;
- a second integrated circuit core comprising a second multiple input shift register for generating a second response signature in response to the test pattern processed by the second integrated circuit core; and
- a checker receiving the first response signature and the second response signature and producing an output signal indicating whether the first response signature is substantially identical to the second response signature.

21. The system of claim 20, wherein the first integrated circuit core additionally comprises a first local clock buffer and the second integrated circuit core additionally comprises a second local clock buffer and the system additionally comprises a clock timing control unit for adjusting either the first local clock buffer or the second local clock buffer when the checker determines that the first response signature is not substantially identical to the second response signature.

22. The system of claim 20, wherein the checker comprises an XOR gate.

23. The system of claim 20, wherein the first multiple input shift register generates the first response signature in response to the test pattern by collecting and compressing output from the first integrated circuit core and the second multiple input shift register generates the second signature in response to the test pattern by collecting and compressing output from the second integrated circuit core.

24. The system of claim 23, wherein the output from the first and second integrated circuit cores is generated by the processing of pseudo random input along one or more pathways of the corresponding integrated circuit cores, the one or more pathways comprise at least one critical path that is limiting of the operating frequency of the integrated circuit, and the pseudo random input is generated by a linear feedback shift register.

* * * * *